(12) United States Patent
Lucovsky et al.

(10) Patent No.: US 6,787,861 B2
(45) Date of Patent: Sep. 7, 2004

(54) NON-CRYSTALLINE OXIDES FOR USE IN MICROELECTRONIC, OPTICAL, AND OTHER APPLICATIONS

(75) Inventors: Gerald Lucovsky, Cary, NC (US); Gregory N. Parsons, Raleigh, NC (US)

(73) Assignee: North Carolina State University, Raleigh, NC (US)

(*) Notice: Subject to any disclaimer, the term of this patent is extended or adjusted under 35 U.S.C. 154(b) by 0 days.

(21) Appl. No.: 09/891,552

(22) Filed: Jun. 25, 2001

(65) Prior Publication Data

US 2002/0024108 A1 Feb. 28, 2002

Related U.S. Application Data

(60) Provisional application No. 60/214,285, filed on Jun. 26, 2000.

(51) Int. Cl.$^7$ ............................................. H01L 29/94
(52) U.S. Cl. ......................................... 257/410; 257/411
(58) Field of Search .................................. 257/410, 411

(56) References Cited

U.S. PATENT DOCUMENTS

| | | | | |
|---|---|---|---|---|
| 5,415,946 A | * | 5/1995 | Friz | 428/697 |
| 5,621,681 A | * | 4/1997 | Moon | 257/295 |
| 5,654,566 A | * | 8/1997 | Johnson | 257/295 |
| 6,060,755 A | | 5/2000 | Ma et al. | 257/410 |
| 6,087,014 A | * | 7/2000 | Dombrowski | 359/642 |
| 6,327,087 B1 | * | 12/2001 | Hashimoto et al. | 359/586 |
| 6,407,435 B1 | * | 6/2002 | Ma et al. | 257/406 |

FOREIGN PATENT DOCUMENTS

| | | |
|---|---|---|
| EP | 0 816 537 A2 | 1/1998 |
| EP | 0 962 986 A2 | 12/1999 |
| JP | 61137390 | 6/1986 |
| WO | WO 00/01008 | 1/2000 |

OTHER PUBLICATIONS

Klein et al., "Thermal Stability of Sol–Gel–Derived Porous AM–AlxZr Mixed Oxide," 1999, America Chemical Society, Chem. of Materials, vol. 11, pp. 2584–2593.*
Aguilar et al., "Melt extraction processing of structural U2O3–Al2O3 fibers," 2000, Journal of the European Ceramic Society, vol. 20, pp. 1091–1098.*
Wilk et al., *High–K Gate Dielectrics: Current Status and Materials Properties Considerations*, Journal of Applied Physics, vol. 89, No. 10, May 15, 2001, pp. 5243–5275.
Lucovsky et al., *Microscopic Model for Enhanced Dielectric Constants in Low Concentration $SiO_2$–Rich Noncrystalline Zr and Hf Silicate Alloys*, Applied Physics Letters, vol. 77, No. 18, Oct. 30, 2000, pp. 2912–2914.
Buchanan et al., 80 nm *Poly–Silicon Gated n–FETs with Ultra–Thin $Al_2O_3$ Gate Dielectric for ULSI Applications*, IEDM, 2000, pp. 223–226.
Robertson et al., *Band Offsets of Wide–Band–Gap Oxides and Implications for Future Electronic Devices*, J. Vac. Sci. Technol. B, vol. 18, No. 3, May/Jun. 2000, pp. 1785–1791.
Gusev et al., *High–Resolution Depth Profiling in Ultrathin $Al_2O_3$ Films on Si*, Applied Physics Letters, vol. 76, No. 2, Jan. 10, 2000, pp. 176–178.
Chin et al., *High Quality $La_2O_3$ and $Al_2O_3$ Gate Dielectrics With Equivalent Oxide Thickness–5–10Å*, 2000 IEEE Symposium on VLSI Technology, Digest of Technical Papers, pp. 16–17.
Klein et al., *Evidence of Aluminum Silicate Formation During Chemical Vapor Deposition of Amorphous $AL_2O_3$ Thin Films on Si(100)*, Applied Physics Letters, vol. 75, No. 25, Dec. 20, 1999, pp. 4001–4003.
Lucovsky, U.S. Ser. No. 09/434,607, filed Nov. 5, 1999.
*International Technology Roadmap for Semiconductors*, 1999 Edition.

(List continued on next page.)

Primary Examiner—Allan R. Wilson
(74) Attorney, Agent, or Firm—Myers Bigel Sibley & Sajovec

(57) ABSTRACT

The invention relates to non-crystalline oxides of formulas (I) and (II), and methods of forming the same, along with field effect transistors, articles of manufacture, and microelectronic devices comprising the non-crystalline oxides.

17 Claims, 1 Drawing Sheet

OTHER PUBLICATIONS

Baumvol, *Atomic Transport DUring Growth of Ultrathin Dielectrics on Silicon*, Surface Science Reports, vol. 36, pp. 1–166, 1999.

Hinds et al., *Investigation of Postoxidation Thermal Treatments of Si/SiO$_2$ Interface in Relationship to the Kinetics of Amorphous Si Suboxide Decomposition*, J. Vac. Sci. Technol. B, vol. 16, No. 4, Jul./Aug. 1998, pp. 2171–2176.

Yasuda et al., *Low–Temperature Formation of Device–Quality SiO$_2$/Si Interfaces by a Two–Step Remote Plasma–Assisted Oxidation/Deposition Process*, J. Vac. Sci. Technol. B, vol. 10, No. 4, Jul./Aug. 1992, pp. 1844–1851.

Hersee et al., *The Operation of Metalorganic Bubblers at Reduced Pressure*, J. Vac. Sci. Technol. A, vol. 8, No. 2, Mar./Apr. 1990, pp. 800–804.

Hunt et al., *The Absolute Determination of Resonant Energies for the Radiative Capture of Protons by Boron, Carbon, Fluorine, Magnesium, and Aluminum in the Energy Range Below 500 kev*, Physical Review, vol. 89, No. 6, Mar. 15, 1953, pp. 1283–1287.

Gordon et al., "*Chemical Vapor Deposition and Properties of Amorphous Aluminum Oxide Films,*" Materials Research Society Symposium Proceedings, 446, Dec. 2–4, 1996, 383–388.

Hauser et al., "*Characterization of Ultra–Thin Oxides Using Electrical C–V and I–V Measurements,*" Characterization and Metrology for ULSI Technology: 1998 International Conference, CP449, 235–239.

Luckovsky et al., "Minimization of Mechanical and Chemical Strain at Dielectric–Semiconductor and Internal Dielectric Interfaces in Stacked Gate Dielectrics for Advanced CMOS Devices," Characterization and Metrology for ULSI technology: 2000 International Conference, CP550, 154–158.

Rayner et al., "*Spectrascopic Evidence for a Network Structure in Plasma–Deposited Ta$_2$O$_5$ Films for Microelectronic Applications,*" Characterization and Metrology for ULSI Technology: 2000 International Confernce, CP550, Jun. 26–29, 2000, 149–153.

Schroder, "*Oxide and Interface Trapped Charges, Oxide Integrity,*"0 Semiconductor Material and Device Characterization, Second Edition, 1998, 337–419.

Vickridge et al., "*Spaces: A PC Implementation of the Stochastic Theory of Energy Loss for Narrow–Resonance Depth Profiling,*" Nuclear Instruments and Methods in Physics Research, B45, 1990 6–11. Presented at Proceedings of the Ninth International Conference on Ion Beam Analysis, Jun. 26–30, 1989.

Hara et al., *Formation of Al$_2$O$_3$–Ta$_2$O$_5$ Double–Oxide Thin Films by Low–Pressure MOCVD and Evaluation of Their Corrosion Resistances in Acid and Alkali Solutions*, Journal of the Electochemical Society, vol. 146, No. 2, 1999, pp. 510–516.

Mikhaeashvili et al., *Electrical Characteristics of Metal–Dielectric–Metal and Metal–Dielectric–Semiconductor Structures Based on Electron Beam Evaporated Y$_2$O$_3$ Ta$_2$O$_3$ and Al$_2$O$_3$ Thin Film*, Journal of Applied Physics, vol. 84, No. 12, Dec. 15, 1998, pp. 6747–6752.

* cited by examiner

NON-CRYSTALLINE OXIDES FOR USE IN MICROELECTRONIC, OPTICAL, AND OTHER APPLICATIONS

CROSS-REFERENCE TO RELATED APPLICATIONS

The present application claims priority to U.S. Provisional Application No. 60/214,285 filed Jun. 26, 2000, the disclosure of which is incorporated herein by reference in its entirety.

FIELD OF THE INVENTION

The invention generally relates to oxide-containing materials, along with articles of manufacture comprising the same, and methods of forming the same.

BACKGROUND OF THE INVENTION

As device dimensions are scaled according to the 1999 Technology Roadmap for Semiconductors, 1999 Edition (http://public.itrs.net), the equivalent gate oxide thickness, EOT, should decrease below about 1.5 nm. At this silicon dioxide ($SiO_2$) thickness, the direct tunneling current for a one volt potential drop across the oxide is typically greater than 1 $A/cm^{-2}$. Such a volt potential drop is potentially disadvantageous in that it begins to reduce the ratio of on- to off-state current in a field effect transistor. In order to attempt to reduce the off-state leakage currents due to tunneling through $SiO_2$ and maintain a capacitance that is equivalent to that obtained with a $SiO_2$ dielectric with a physical thickness of 1.5 nm and below, alternative high-k dielectrics are being investigated. See e.g., J. Robertson, *J. Vac. Sci. Technol. B* 18(3) (2000) and G. D Wilk, et al., *J. Appl. Phys.* 89, 5243 (2001). These high-k alternative dielectrics are potentially capable of providing the required levels of EOT for device scaling at larger physical thickness. Thus, a pathway for the potential reduction of tunneling current is provided. Other factors such as conduction band offset energies also are believed to play a role in influencing tunnel leakage, and these offset energies generally decrease with increasing k.

Recently, aluminum oxide has been the focus of several studies. Klein et al. *Appl. Phys. Lett.* 75, 4001 (1999) propose the deposition of aluminum oxide with a CVD growth method. This reference proposes a silicate layer being present at the interface on aluminum oxide and silicon, as measured by nuclear resonance profiling (NRP) and X-ray photoelectron spectroscopy (XPS). Gusev et al. *Appl. Phys. Lett.* 76, 176 (2000) propose atomic layer CVD (ALCVD) where they investigated both the physical and electrical properties of an aluminum oxide layer. Gusev et al. propose that it is possible to deposit aluminum oxide on hydrogen-terminated silicon without forming an interfacial layer using NRP, medium energy ion scattering (MEIS), and high-resolution transmission electron microscopy (TEM). Transistors with an equivalent gate oxide thickness of 0.96 nm with aluminum oxide as the material are proposed by Chin et al. *Tech. Dig. VLSI Symp,* 16 (2000). Chin et al. proposes that these devices have a $D_{it}$ value greater than or equal to $3^{10}$ $cm^{-2}$ and a positive flat band shift, indicating a negative fixed charge. Buchanan et al., *Tech. Dig. Intl. Electron Devices Meet,* 223 (2000) propose an nMOSFET formed by ALCVD $Al_2O_3$ with 0.08 μm gate lengths. This reference also proposes a negative fixed charge for devices with an equivalent oxide thickness of 1.3 nm.

Notwithstanding the above, there remains a need in the art for oxide materials that may be used in semiconductor devices which have the potential to reduce direct tunneling current in the devices.

SUMMARY OF THE INVENTION

The present invention addresses the inadequacies of the prior art. In one aspect, the invention provides a non-crystalline oxide represented by the formula (I):

$$—(ABO_4)_x(M_nO_m)_{1-x}— \qquad (I)$$

wherein:
  A is an element selected from Group IIIA of the periodic table;
  B is an element selected from Group VB of the periodic table;
  O is oxygen;
  M is an element selected from either Group IIIB or Group IVB of the periodic table; and
  n ranges from about 0.5 to about 2.5, m ranges from about 1.5 to about 3.5, and x is a fraction ranging from 0 to 1.

In another aspect, the invention provides a a non-crystalline oxide represented by the formula (II):

$$—(AlO_2)_j(M_nO_m)_k— \qquad (II)$$

wherein:
  Al is aluminum;
  O is oxygen;
  M is an element selected from either Group IIIB or Group IVB of the periodic table; and
  j ranges from about 0.5 to about 4.5; k is equal to about 1; n ranges from about 0.5 to about 2.5, and m ranges from about 1.5 to about 3.5.

In another aspect, the invention provides methods of forming a non-crystalline oxide represented by the formulas (I) and (II) as described in greater detail hereinbelow.

In another aspect, the invention provides a field effect transistor. The field effect transistor comprises an integrated circuit substrate having a first surface, source and drain regions in the substrate at the first surface in a spaced apart relationship, and a gate insulating layer on the substrate at the first surface between the spaced apart source and drain regions. The gate insulating layer comprises any of the non-crystalline oxides represented by formulas (I) or (II) described hereinbelow.

These and other aspects and advantages of the present invention are set forth hereinbelow.

DETAILED DESCRIPTION OF THE PREFERRED EMBODIMENTS

Figure 1A:
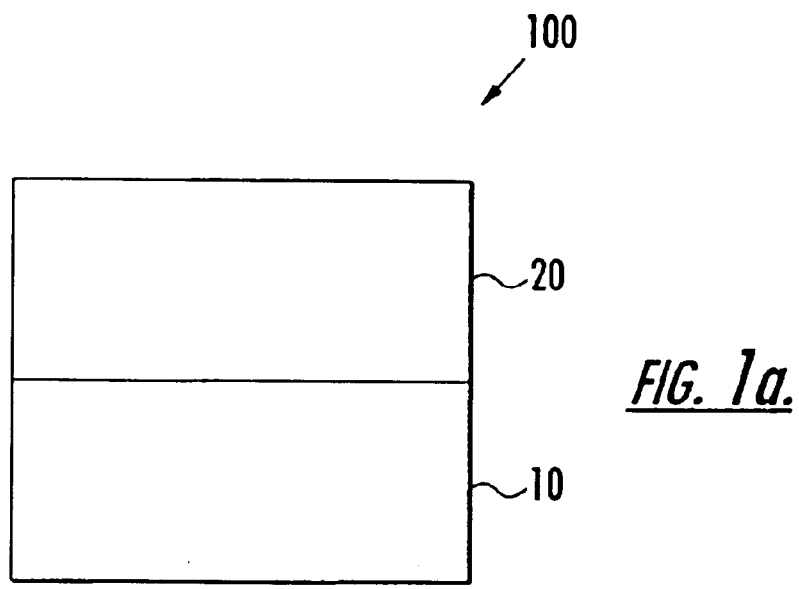
FIGS. 1a and 1b illustrate layers used in microelectronic devices employing the non-crystalline oxides of the invention.

The invention will now be described in detail with reference to the following embodiments set forth herein. It should be appreciated that these embodiments merely serve to illustrate the invention and do not limit the scope of the invention. In the drawings, like numbers refer to like elements throughout. In addition, the term "on" is construed to mean a structure actually contacting an adjoining structure, or in close proximity to the adjoining structure without actually contacting it.

In one aspect, the invention provides a non-crystalline oxide represented by the formula (I):

$$—(ABO_4)_x(M_nO_m)_{1-x}—\qquad(I)$$

wherein:
A is an element selected from Group IIIA of the periodic table;
B is an element selected from Group VB of the periodic table;
O is oxygen;
M is an element selected from either Group IIIB or Group IVB of the periodic table; and n ranges from about 0.5 to about 2.5, m ranges from about 1.5 to about 3.5, and x is a fraction ranging from 0 to 1.

In one embodiment encompassing the oxide represented by formula (I), A is aluminum (Al), B is tantalum (Ta), M is selected from halfnium (Hf) or zirconium (Zr), n is 1, m is 2, and x is less than 0.25.

In another embodiment encompassing the oxide represented by formula (I), A is aluminum (Al), B is tantalum (Ta), M is selected from yttrium (Y) or lanthanum (La), n is 2, m is 3, and x is less than 0.25.

In another aspect, the invention provides a non-crystalline oxide represented by the formula (II):

$$—(AlO_2)_j(M_nO_m)_k—\qquad(II)$$

wherein:
Al is aluminum;
O is oxygen;
M is an element selected from either Group IIIB or Group IVB of the periodic table; and
j ranges from about 0.5 to about 4.5; k is equal to about 1; n ranges from about 0.5 to about 2.5, and m ranges from about 1.5 to about 3.5.

In one embodiment regarding the oxide represented by formula (II), M is selected from halfnium (Hf) or zirconium (Zr), n is 1, m is 2, j is 4, and k is 1.

In another embodiment regarding the oxide represented by formula (II), M is selected from yttrium (Y) or lanthanum (La), n is 2, m is 3, j is 3, and k is 1.

The novel materials of the invention are believed to have bonding properties, and hence electrical and optical properties, potentially similar to those of thin film silicates. In addition, this novel class of materials offers potential properties that may not be realized in conventional silicate alloys, and therefore opens new applications in microelectronics and other technologies.

This invention proposes novel non-crystalline oxides. In the non-crystalline oxides of formula (I), the $SiO_2$ component of the silicates is replaced by a Group IIIA-VA or B analog network structure such as $AlPO_4$, or $AlTaO_4$ as described in Ser. No. 09/434,607 filed Nov. 5, 1999, the disclosure of which is incorporated herein by reference in its entirety ("the '607 application"). Although not intending to be bound by theory, alloying these binary alloys with additional metal oxides that are more ionic that $Al_2O_3$ is believed to introduce positive metal ions which interrupt or modify the $AlO_2^{1-}$ and $(P \text{ or } Ta)O_2^{1+}$ network of the host oxide and provide bonding that is qualitatively similar to the $SiO_2$_ based silicates. Other group three metal atoms with electronegativities greater than 1.6, e.g., Ga, may also be substituted for Al, and other group VA or B elements for Ta, e.g., As, Sb, and Nb and the like.

The non-crystalline oxides of formula (II) corresponds to stoichiometric or near stoichiometric aluminates, wherein the network component is believed to be significantly reduced by alloying with a more ionic metal oxide, such as $Zr(Hf)O_2$ or $Y(La)_2O_3$. Although not intending to be bound by theory, it is believed that the rational for these structures derives from the vast number of alumino-silicate mineral species that exist in nature. The number of positive ions necessary for compensating the $AlO_2^{1-}$ groups may be determined by the number of these groups. For example, representative oxides in the second group include: $Zr(Hf)(AlO_2)_4$ and $Y(La)(AlO_2)_3$. These can also be described as mixed oxides as $Zr(Hf)O_2(Al_2O_3)_2$ and $Y(La)_2O_3(Al_2O_3)_3$. These materials can be customized to provide either neutral or charged bonding arrangements with elemental or compound semiconductors.

In addition to the above, the invention relates to methods of forming the non-crystalline oxides of the invention. More particularly, in one aspect, the invention provides a method of forming a non-crystalline oxide represented by the formula (I):

$$—(ABO_4)_x(M_nO_m)_{1-x}—\qquad(I)$$

wherein A is an element selected from Group IIIA of the periodic table, B is an element selected from Group VB of the periodic table, O is oxygen, M is an element selected from either Group IIIB or Group IVB of the periodic table, n ranges from about 0.5 to about 2.5, m ranges from about 1.5 to about 3.5, and x is a fraction ranging from 0 to 1. The method comprises delivering a gaseous source comprising element A, a gaseous source comprising element B, a gaseous source comprising element M, and a gaseous source comprising oxygen on a substrate such that the gaseous source comprising element A, the gaseous source comprising element B, the gaseous source comprising element M, and the gaseous source comprising oxygen react to form the non-crystalline oxide represented by the formula (I).

Gaseous sources containing more than one element per source are encompassed by the invention (e.g., mixed sources). In a preferred embodiment, the elements A, B and M are delivered in amounts necessary (i.e., sufficient) for achieving chemical 'stoichiometry, i.e., deposited thin films with the required ratios of network and network modifier ions to achieve stoichiometry of the their constituent oxides. Preferably, the gaseous sources comprising oxygen contain a sufficient amount of oxygen such that the elements A, B and M are completely oxidized. In one embodiment, the delivery step is carried out as a deposition.

The oxygen which is present in the gaseous source of the above method of forming the non-crystalline oxide represented by formula (I) may be selected from a number of species. Exemplary species include, without limitation, oxygen atoms, oxygen ions, oxygen metastables, oxygen molecular ions, oxygen molecular metastables, compound oxygen molecular ions, compound oxygen metastables, compound oxygen radicals, and mixtures thereof. In a preferred embodiment, the gaseous source comprising oxygen comprises $O_2$ Or $N_2O$. It is particularly preferred that the formation of the non-crystalline oxides take place in non-equilibrium chemical environments.

The depositing step of the method of forming the non-crystalline oxide represented by formula (I) may occur by various techniques. In one preferred embodiment, the depositing step includes a remote plasma-enhanced chemical vapor deposition occurring in a reactor, and wherein the remote-plasma-enhanced chemical vapor deposition comprises subjecting the gaseous source comprising oxygen to radio-frequency plasma-excitation or microwave frequency plasma-excitation. The gaseous source comprising oxygen further comprises a rare gas element, and the gaseous oxygen-containing source is injected into the reactor upstream relative to the gaseous source comprising element A, the gaseous source comprising element B, and the gaseous source comprising element M.

In another aspect, the invention provides a method of forming a non-crystalline oxide represented by the formula (II):

$$—(AlO_2)_j(M_nO_m)_k—\qquad\qquad\text{(II)}$$

wherein:

Al is aluminum, O is oxygen, M is an element selected from either Group IIIB or Group IVB of the periodic table, j ranges from about 0.5 to about 4.5, k is equal to about 1, n ranges from about 0.5 to about 2.5, and m ranges from about 1.5 to about 3.5. The method comprises delivering a gaseous source comprising aluminum, a gaseous source comprising element M, and a gaseous source comprising oxygen on a substrate such that the gaseous source comprising aluminum, the gaseous source comprising element M, and the gaseous source comprising oxygen react to form the non-crystalline oxide represented by the formula (II).

In a preferred embodiment, the method of forming the non-crystalline oxide represented by formula (II) is preferably carried out in a manner such that elements aluminum and M are present in amounts sufficient to achieve chemical stoichiometry, with the term "chemical stoichiometry" being defined herein. Preferably, the gaseous source comprising oxygen contains a sufficient amount of oxygen such that the elements aluminum and M are completely oxidized.

In a preferred embodiment, the oxygen employed in the method of forming a non-crystalline oxide represented by the formula (II) may be selected from various species. Preferably, the oxygen in the gaseous source is selected from the group consisting of oxygen atoms, oxygen ions, oxygen metastables, oxygen molecular ions, oxygen molecular metastables, compound oxygen molecular ions, compound oxygen metastables, compound oxygen radicals, and mixtures thereof. In a preferred embodiment, the gaseous source comprising oxygen comprises $O_2$ or $N_2O$. Mixtures of the above can also be employed. It is particularly preferred that the formation of the non-crystalline oxide represented by formula (II) take place in a non-equilibrium chemical environment.

The depositing step of the method of forming the non-crystalline oxide represented by formula (II) may be carried out according to various techniques. In one preferred embodiment, the depositing step is a remote plasma-enhanced chemical vapor deposition that occurs in a reactor. Preferably, the remote-plasma-enhanced chemical vapor deposition comprises subjecting the gaseous source comprising oxygen to radio-frequency plasma-excitation or microwave frequency plasma-excitation. The gaseous source comprising oxygen further comprises a rare gas element and the gaseous oxygen-containing source is injected into the reactor upstream relative to the gaseous source comprising aluminum and the gaseous source comprising element M.

Various gaseous sources comprising any of the applicable elements for the above methods may be employed for the purposes of the invention. Examples of gaseous sources comprising the elements may include, but are not limited to, alkoxide compounds, organometallic compounds, inorganic compounds, and mixtures thereof. Preferably, the alkoxide compound is selected from the group consisting of an ethoxide, a propoxide, and a butoxide. When the element is aluminum, it is preferred that the gaseous source comprises trimethyl aluminum. Other gaseous sources comprising the elements can be used such as organo-metallic source gases including those that are capable of producing the desired binary oxides (e.g., diketonates) along with other organo-metallics that contain metal-oxygen bonds. Other inorganic sources of the elements can be employed such as halides and nitrates. The gaseous sources comprising the element(s) can be derived through the evaporation of respective liquid sources comprising these elements, particularly in embodiments in which the deposition involves a physical deposition or a plasma chemical vapor deposition process.

The gaseous sources comprising the elements which are employed in the methods of the invention may further comprise other components such as, for example, inert gases (e.g., argon (Ar) helium (He), or other noble gases, as well as mixtures thereof.

As alluded to hereinabove, a number of deposition techniques can be used in forming the non-crystalline oxides represented by formulas (I) and (II) of the invention. Examples of these techniques include, without limitation, those described in the '607 application. Exemplary techniques include, but are not limited to, a laser-assisted chemical vapor deposition, a direct or remote plasma assisted chemical vapor deposition, a electron cyclotron resonance chemical vapor deposition, and a reactive physical vapor deposition. In one embodiment, a remote plasma assisted chemical deposition is employed. Various reactive physical vapor depositions can be used such as, for example, a thermal evaporation, an electron beam evaporation, a parallel plate radio frequency (rf) sputtering, a direct current (dc) sputtering, a radio frequency (rf) magnetron sputtering, and a direct current (dc) magnetron sputtering. A reactive physical vapor deposition may also occur in the form of an atomic layer absorption process. The invention is often carried out by remote plasma-enhanced chemical vapor deposition (i.e., REPCVD).

The methods of the invention may be carried out under any number of temperature and pressure conditions. The methods of the invention may be carried out using known equipment, including, for example, a suitable reactor (e.g., reaction chamber or vessel). In one embodiment, alkoxide liquids comprising elements are injected into a reactor downstream from a remote radio-frequency excited plasma. Preferably, the alkoxides are liquids at room temperature, but at the temperature range employed in the reactor have sufficient levels of vapor to be transported into the reactor. A microwave plasma may be employed if so desired. In one embodiment, the processing pressure may range from about 200 to about 400 mTorr and the temperature of the substrate upon which the oxides are formed ranges from about 200° C. to about 300° C. In a preferred embodiment, silane may be used as a precursor of Si and metal organics for Al and transition metals such as, for example, Ta, Zr, Hf, Y, and the like. An oxygen source encompassing those, without limitation, set forth herein, is preferably delivered upstream through plasma, diluted with He. The silane and metal organics are preferably delivered downstream. In other various embodiments, nitrate sources can be employed for Ti, Hf, and Zr, e.g., $Zr(NO_3)_4$. Other techniques include, without limitation, atomic layer deposition using water as the oxidizing agent, and silane metal organic sources for other constituents. An example of a source gas for Zr is Zr t-butoxide. Source gases for Ta and Al as well as other metals can also be used.

In another aspect, the invention relates to a field effect transistor. The field effect transistor comprises an integrated circuit substrate having a first surface, source and drain regions in the substrate at the first surface in a spaced apart relationship, a gate insulating layer on the substrate at the first surface between the spaced apart source and drain regions. The gate insulating layer comprising a non-crystalline oxide represented by the formula (I):

$$—(ABO_4)_x(M_nO_m)_{1-x}— \qquad (I)$$

wherein:

A is an element selected from Group IIIA of the periodic table;

B is an element selected from Group VB of the periodic table;

O is oxygen;

M is an element selected from either Group IIIB or Group IVB of the periodic table;

n ranges from about 0.5 to about 2.5;

m ranges from about 1.5 to about 3.5; and x is a fraction ranging from 0 to 1.

The non-crystalline oxide represented by the formula (I) employed in the field effect transistor may include, without limitation, all species described by this formula.

In one embodiment, the field effect transistor which employs the non-crystalline oxide represented by formula (I) comprises a material selected from the group consisting of a Group III-V binary alloy, a Group II-V quaternary alloy, a Group III-nitride alloy, and combinations thereof.

In another embodiment, the substrate of the above field effect transistor comprises a Group III-V binary alloy selected from the group consisting of (Ga,Al)As, (In,Ga)As, and combinations thereof.

In another aspect, the invention also provides a field effect transistor which employs a non-crystalline oxide represented by the formula (II). The field effect transistor comprises an integrated circuit substrate having a first surface, source and drain regions in the substrate at the first surface in a spaced apart relationship, a gate insulating layer on said substrate at the first surface between said spaced apart source and drain regions, the gate insulating layer comprising a non-crystalline oxide represented by the formula (II):

$$—(AlO_2)_j(M_nO_m)_k— \qquad (II)$$

wherein:

Al is aluminum, O is oxygen, M is an element selected from either Group IIIB or Group IVB of the periodic table, j ranges from about 0.5 to about 4.5, k is equal to about 1, n ranges from about 0.5 to about 2.5, and m ranges from about 1.5 to about 3.5.

In one embodiment, the substrate of the field effect transistor which employs a non-crystalline oxide of formula (II) comprises a material selected from the group consisting of a Group III-V binary alloy, a Group III-V quaternary alloy, a Group III-nitride alloy, and combinations thereof.

In another embodiment, the substrate of the field effect transistor which employs the non-crystalline oxide of formula (II) comprises a Group III-V binary alloy selected from the group consisting of (Ga,Al)As, (In,Ga)As, and combinations thereof.

Examples of proposed applications for the novel non-crystalline oxides of the invention include, without limitation, integration of the single layer or stacked non-crystalline oxides into gate stacks for NMOS, PMOS or CMOS applications involving Si, SiC and other compound semiconductors such as the III-V arsenides, antimonides, nitrides or phosphides, etc. In various embodiments, the layers can also be used in a number of articles of manufacture that comprise the non-crystalline oxides represented by the formulas (I) and (II). Examples of articles of manufacture include, without limitation, passivation layers on other types of devices, e.g., photoconductors, photodiodes, light-emitting diodes, lasers, sensors, and micro-mechanical (MEMS) devices. Additionally, for example, they also can be used in devices with metal electrodes, such as spin-valves, or metal interface amplifiers. They also can be used for articles used sensor and catalysis applications.

The non-crystalline oxides of the invention may be used in a number of ways in various stacked structures that are employed in a variety of microelectronic devices such as, without limitation, those described herein. Examples of such structures include 100 and 200 as depicted in the drawings. For example, in one embodiment of a stacked structure depicted in FIG. 1a, interfacial layer 10 may comprise any number of appropriate materials such as, in one illustration, the oxides recited in the '607 application (e.g., AlTaO₄). Additionally, the interfacial layer 10 may comprise a non-crystalline oxide of formula (I) described herein or a non-crystalline oxide of formula (II) described herein. Any combinations of the above materials can be employed in interfacial layer 10.

Referring again to FIG. 1a, present on the interfacial layer 10 is base layer 20. The base layer 20 may comprise a non-crystalline oxide of the formula (I) described herein, a non-crystalline oxide of the formula (II) described herein, or any combination of these two materials, as well as any of the oxides disclosed in the '607 application. In another embodiment, the base layer 20 may comprise an oxide of the formula (III):

$$D(AlO_2)_z \qquad (III)$$

wherein D is Group IIIB or IVB oxide and z is an integer, preferably 3 or 4. In preferred embodiments, the oxide of formula may be selected from $Hf(AlO_2)_4$ or $Y(AlO_2)_3$, as well as combinations thereof. Combinations of any of the above disclosed oxides can be utilized in the base layer 20, as well as others.

Figure 1B:
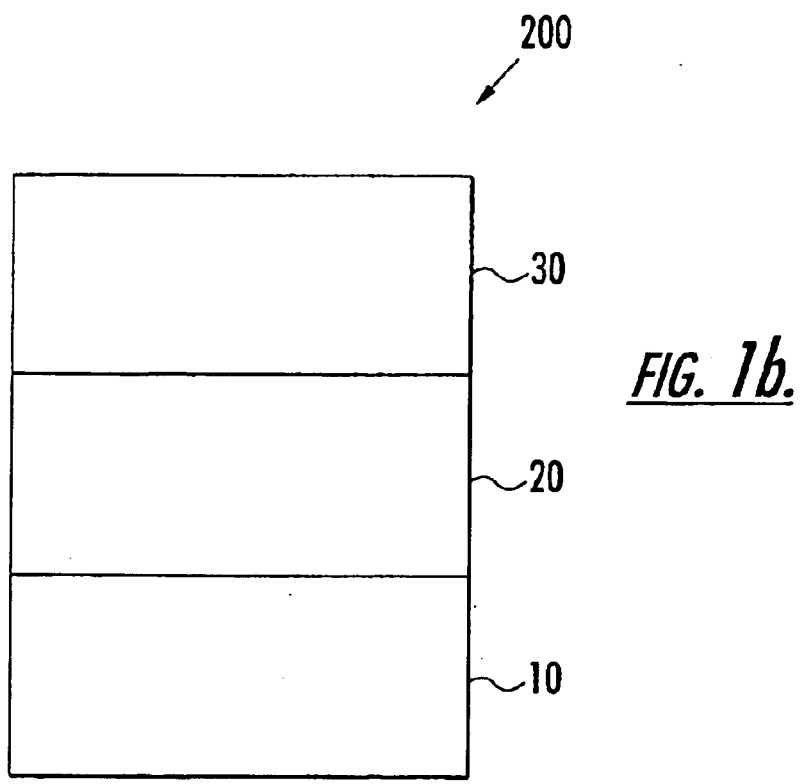

In addition, as shown in FIG. 1b, a surface/interface layer 30 can be employed on top of base layer 20. In one embodiment, layer 30 may comprise nitrogen. In other embodiments, layer 30 may comprise any number of oxides such as, without limitation, an oxide of the second group (i.e., Group (II)) described herein (e.g., $Zr(Hf)(AlO_2)_4$ or $Y(La)(AlO_2)_3$), an oxide disclosed in the '607 application (e.g., $TiAlO_4$) as well as others, alone or in combination with nitrogen. In various embodiments, metal is on top of surface/interface layer 30. Accordingly, elements employed in various oxides may be selected to match the contacting metal. Combinations of any of the above materials can be employed in layer 30.

One novel and unusual feature is a recognition that macroscopically neutral covalent random network structures comprised of alternative charged network groups can have properties tailored by the addition of other metal ions, as in conventional silicates with a neutral $SiO_2$ network forming group. A second novel and unusual feature is the identification of networks that have constituents which can provide neutral or charged network bonding at interfaces according to their composition. The disclosure of these materials allows for new potential options for integration into devices, most noteworthy is the ability to control the nature of the band bending at elemental and compound semiconductor interfaces. Surface modification also allows for unique opportunities for sensors and/or catalytic applications. As such, the novel materials of the invention can be integrated into devices with elemental or compound semiconductors as gate dielectric or passivation layers for microelectronic or optical applications. They can also be used metals in spin valve devices and metal interface amplifiers. Finally, they provide pathways to surface modification for applications in sensing and catalysis.

The invention has been described in detail with respect to the embodiments set forth hereinabove. It should be appreciated that the embodiments are merely set forth to illustrate the invention, and do not serve to limit the invention as defined by the claims.

The invention has been described with respect to various embodiments set forth in the specification and drawings. It should be appreciated that these embodiments are for illustrative purposes only, and do not limit the scope of the invention as described by the claims that follow.

That which is claimed:

1. A non-crystalline oxide represented by the formula (II):

$$(Al_2O_3)_j(M_nO_m)_k \qquad (II)$$

wherein:
Al is aluminum;
O is oxygen;
M is selected from the group consisting of scandium (Sc), titanium (Ti), zirconium (Zr) and hafnium (Hf); and
j ranges from about 0.5 to about 4.5; k is equal to about 1; n ranges from about 0.5 to about 2.5, and m ranges from about 1.5 to about 3.5.

2. A non-crystalline oxide represented by the formula (II):

$$(Al_2O_3)_j(M_nO_m)_k \qquad (II)$$

wherein:
Al is aluminum;
O is oxygen; and
M is hafnium (Hf) or zirconium (Zr), n is 1, m is 2, j is 4, and k is 1.

3. A field effect transistor comprising:
an integrated circuit substrate having a first surface;
source and drain regions in said substrate at said first surface in a spaced apart relationship; and
a gate insulating layer on said substrate at said first surface between said spaced apart source and drain regions, said gate insulating layer comprising a non-crystalline oxide represented by the formula (II):

$$(Al_2O_3)_j(M_nO_m)_k \qquad (II)$$

wherein:
Al is aluminum, O is oxygen, M is selected from the group consisting of scandium (Sc), titanium (Ti), zirconium (Zr) and hafnium (Hf), j ranges from about 0.5 to about 4.5, k is equal to about 1, n ranges from about 0.5 to about 2.5, and m ranges from about 1.5 to about 3.5.

4. A field effect transistor comprising:
an integrated circuit substrate having a first surface;
source and drain regions in said substrate at said first surface in a spaced apart relationship; and
a gate insulating layer on said substrate at said first surface between said spaced apart source and drain regions, said gate insulating layer comprising a non-crystalline oxide represented by the formula (II):

$$(Al_2O_3)_j(M_nO_m)_k \qquad (II)$$

wherein:
Al is aluminum, O is oxygen, M is selected from the group consisting of scandium (Sc), lanthanum (La), actinium (Ac), titanium (Ti), zirconium (Zr), hafnium (Hf), and rutherfordium (Rf), j ranges from about 0.5 to about 4.5, k is equal to about 1, n ranges from about 0.5 to about 2.5, and m ranges from about 1.5 to about 3.5, wherein the substrate comprises a material selected from the group consisting of a Group III-V binary alloy, a Group III-V quaternary alloy, a Group III-nitride alloy, and combinations thereof.

5. A field effect transistor comprising:
an integrated circuit substrate having a first surface;
source and drain regions in said substrate at said first surface in a spaced apart relationship; and
a gate insulating layer on said substrate at said first surface between said spaced apart source and drain regions, said gate insulating layer comprising a non-crystalline oxide represented by the formula (II):

$$(Al_2O_3)_j(M_nO_m)_k \qquad (II)$$

wherein:
Al is aluminum, O is oxygen, M is selected from the group consisting of scandium (Sc), lanthanum (La), actinium (Ac), titanium (Ti), zirconium (Zr), hafnium (Hf), and rutherfordium (Rf), j ranges from about 0.5 to about 4.5, k is equal to about 1, n ranges from about 0.5 to about 2.5, and m ranges from about 1.5 to about 3.5, wherein the substrate comprises a Group III-V binary alloy selected from the group consisting of (Ga,Al)As, (In,Ga)As, and combinations thereof.

6. A field effect transistor comprising:
an integrated circuit substrate having a first surface;
source and drain regions in said substrate at said first surface in a spaced apart relationship; and
a gate insulating layer on said substrate at said first surface between said spaced apart source and drain regions, said gate insulating layer comprising a non-crystalline oxide represented by the formula (II):

$$(Al_2O_3)_j(M_nO_m)_k \qquad (II)$$

wherein:
Al is aluminum, O is oxygen, M is selected from the group consisting of scandium (Sc), lanthanum (La), actinium (Ac), titanium (Ti), zirconium (Zr), hafnium (Hf), and rutherfordium (Rf), j ranges from about 0.5 to about 4.5, k is equal to about 1, n ranges from about 0.5 to about 2.5, and m ranges from about 1.5 to about 3.5, wherein M is hafnium (Hf) or zirconium (Zr), n is 1, m is 2, j is 4, and k is 1.

7. A microelectronic device comprising a non-crystalline oxide according to claim 1.

8. The microelectronic device according to claim 7, wherein said microelectronic device comprises a base layer and an interfacial layer positioned thereon.

9. The microelectronic device according to claim 7, wherein the non-crystalline oxide represented by formula (II) is present in said interfacial layer.

10. The microelectronic device according to claim 7, wherein the non-crystalline oxide represented by formula (II) is present in the base layer.

11. The microelectronic device according to claim 7, wherein the base layer comprises an oxide of the formula (III):

$$D(AlO_2)_z \quad \text{(III)}$$

wherein D is Group IIIB or IVB oxide and z is 3 or 4.

12. The microelectronic device according to claim 11, wherein the oxide of the formula (III) is selected from the group consisting of $Hf(AlO_2)_4$, $Y(AlO_2)_3$, and combinations thereof.

13. An article of manufacture comprising the non-crystalline oxide represented by formula (II) according to claim 1.

14. The article of manufacture according to claim 13, wherein the article of manufacture is selected from the group consisting of photoconductors, photodiodes, light-emitting diodes, lasers, sensors, micro-mechanical (MEMS) devices, and devices with metal electrodes, articles used in sensor applications, and articles used in catalysis applications.

15. The field effect transistor according to claim 13, wherein the substrate comprises a material selected from the group consisting of a Group III-V binary alloy, a Group III-V quaternary alloy, a Group III-nitride alloy, and combinations thereof.

16. The field effect transistor according to claim 13, wherein the substrate comprises a Group III-V binary alloy selected from the group consisting of (Ga,Al)As, (In,Ga)As, and combinations thereof.

17. The field effect transistor according to claim 13, wherein M is hafnium (Hf) or zirconium (Zr), n is 1, m is 2, j is 4, and k is 1.

* * * * *

UNITED STATES PATENT AND TRADEMARK OFFICE
CERTIFICATE OF CORRECTION

PATENT NO. : 6,787,861 B2
DATED : September 7, 2004
INVENTOR(S) : Lucovsky et al.

It is certified that error appears in the above-identified patent and that said Letters Patent is hereby corrected as shown below:

Column 12,
Line 4, should read -- 15. The field effect transistor according to claim 3, --
Line 9, should read -- 16. The field effect transistor according to claim 3, --
Line 13, should read -- 17. The field effect transistor according to claim 3, --

Signed and Sealed this

First Day of February, 2005

JON W. DUDAS
*Director of the United States Patent and Trademark Office*